(12) United States Patent  
Tseng et al.

(10) Patent No.: US 7,948,283 B2  
(45) Date of Patent: May 24, 2011

(54) APPARATUS FOR AWAKING AN ELECTRONIC DEVICE FROM A STANDBY MODE

(75) Inventors: Ching-Hung Tseng, Hsinchu (TW); Ta-Ming Liu, Hsinchu (TW)

(73) Assignee: Tritan Technology Inc., Hsinchu (TW)

( * ) Notice: Subject to any disclaimer, the term of this patent is extended or adjusted under 35 U.S.C. 154(b) by 0 days.

(21) Appl. No.: 12/010,311

(22) Filed: Jan. 23, 2008

(65) Prior Publication Data

US 2010/0295583 A1    Nov. 25, 2010

(51) Int. Cl.  
*H03L 7/00* (2006.01)

(52) U.S. Cl. .................... 327/143; 327/544

(58) Field of Classification Search .......... 327/143, 327/198, 544  
See application file for complete search history.

(56) References Cited

U.S. PATENT DOCUMENTS

| | | | | |
|---|---|---|---|---|
| 4,394,702 A | * | 7/1983 | Boothe | 361/92 |
| 5,237,698 A | * | 8/1993 | Ohmae | 714/23 |
| 5,355,024 A | * | 10/1994 | Elliott et al. | 307/73 |
| 5,670,865 A | * | 9/1997 | Farwell | 323/285 |
| 6,078,154 A | * | 6/2000 | Manlove et al. | 318/293 |
| 6,211,664 B1 | * | 4/2001 | Bonnefoy et al. | 324/102 |
| 6,534,990 B2 | * | 3/2003 | Hocken et al. | 324/416 |
| 6,738,914 B2 | * | 5/2004 | Christopher | 713/323 |
| 7,109,865 B2 | * | 9/2006 | Paradiso et al. | 340/572.1 |
| 7,391,176 B2 | * | 6/2008 | Grehant | 318/466 |
| 7,634,202 B2 | * | 12/2009 | Kitazawa et al. | 399/9 |
| 7,757,106 B2 | * | 7/2010 | Liu | 713/300 |
| 7,760,194 B2 | * | 7/2010 | Sakurai | 345/177 |
| 2007/0173958 A1 | * | 7/2007 | Solomon | 700/10 |
| 2008/0141053 A1 | * | 6/2008 | Nishikawa et al. | 713/340 |
| 2008/0283876 A1 | * | 11/2008 | Souda | 257/254 |
| 2009/0070608 A1 | * | 3/2009 | Kobayashi | 713/320 |
| 2009/0289606 A1 | * | 11/2009 | Lauxtermann et al. | 320/166 |
| 2011/0001832 A1 | * | 1/2011 | Ngo et al. | 348/187 |

* cited by examiner

*Primary Examiner* — Thomas J Hiltunen  
(74) *Attorney, Agent, or Firm* — Jackson IPG PLLC; Demian K. Jackson

(57) ABSTRACT

An apparatus is used to awake an electronic device to an active mode from a standby mode in case of change in the voltage of a power supply of the electronic device. The apparatus includes a power supply for supplying electricity, a switch connected to the power supply, a low-voltage reset unit connected to the switch, a micro-controller unit connected to the switch and a monitoring and awaking unit. The monitoring and awaking unit includes an actuator connected to the switch, a bias generator and the actuator through a comparator connected to the micro-processing unit. The control over the power supply by the switch causes change in the voltage of the actuator which cooperates with the bias generator and the comparator to generate an awaking signal to awake the micro-processing unit.

7 Claims, 2 Drawing Sheets

APPARATUS FOR AWAKING AN ELECTRONIC DEVICE FROM A STANDBY MODE

FIELD OF THE INVENTION

The present invention relates to an apparatus for awaking an electronic device to an active mode from a standby mode in case of change in the voltage of a power supply of the electronic device so that the operation of the electronic device is economic and efficient and that the change to the active mode from the standby mode is fast.

DESCRIPTION OF THE RELATED ARTS

Many electronic devices are energized by batteries. Because of limited electricity stored in such a battery, such an electronic device cannot always be in an active mode. Such an electronic device often includes a standby/awaking unit to switch it between an active mode for working and a standby mode for saving electricity.

Referring to FIG. 2, a conventional standby/awaking unit 7 includes a power supply 71, a switch 72, a regulating capacitor 73, a low-voltage reset circuit 74, a micro-controller unit and an awaking signal-detecting circuit 76. When the micro-controller unit 75 is not needed, it is in a standby mode to save electricity. In the standby mode, in case the switch is opened and closed again, the supply of electricity will be recovered. The micro-controller unit 75 lowers the voltage according to the consumption of electricity in the power supply 71. There are two scenarios as follows:

Firstly, the voltage of the power supply 71 is lower than a voltaic level of the low-voltage reset unit 74 so that reset is executed. In this case, the micro-controller unit 75 can be normally operated.

Secondly, the voltage of the power supply 71 is higher than the voltaic level of the low-voltage reset unit 74 so that reset is not executed. In this case, the micro-controller unit 75 is retained in the standby mode. Without any awaking signal, the micro-controller unit 75 cannot detect the re-supply of electricity via any input pin to actuate itself.

However, in the standby mode, the power supply 71 does not energize the units except the awaking signal-detecting circuit 76. Therefore, the awaking signal-detecting circuit 76 consumes electricity and becomes a voltaic discharge path. The consumption of electricity by this voltaic discharge path cannot be too much to increase the loss of electricity in the standby mode. At this instant, the discharge by the power supply 71 is slow so that quick turning off and on again cannot reset or awake the electronic device. Therefore, the convenience in the operation of the electronic device is jeopardized.

The present invention is therefore intended to obviate or at least alleviate the problems encountered in prior art.

SUMMARY OF THE INVENTION

The primary objective of the present invention is to provide an apparatus for awaking an electronic device to an active mode from a standby mode in case of change in the voltage of a power supply of the electronic device so that the operation of the electronic device is economic and efficient and that the change to the active mode from the standby mode is fast.

To achieve the foregoing objective, the apparatus includes a power supply for supplying electricity, a switch connected to the power supply, a low-voltage reset unit connected to the switch, a micro-controller unit connected to the switch and a monitoring and awaking unit. The monitoring and awaking unit includes an actuator connected to the switch, a bias generator and the actuator through a comparator connected to the micro-processing unit. The control over the power supply by the switch causes change in the voltage of the actuator which cooperates with the bias generator and the comparator to generate an awaking signal to awake the micro-processing unit.

Other objectives, advantages and features of the present invention will become apparent from the following description referring to the attached drawings.

BRIEF DESCRIPTION OF THE DRAWINGS

The present invention will be described via the detailed illustration of the preferred embodiment in view of prior art referring to the drawings.

DETAILED DESCRIPTION OF EMBODIMENT

Figure 1:
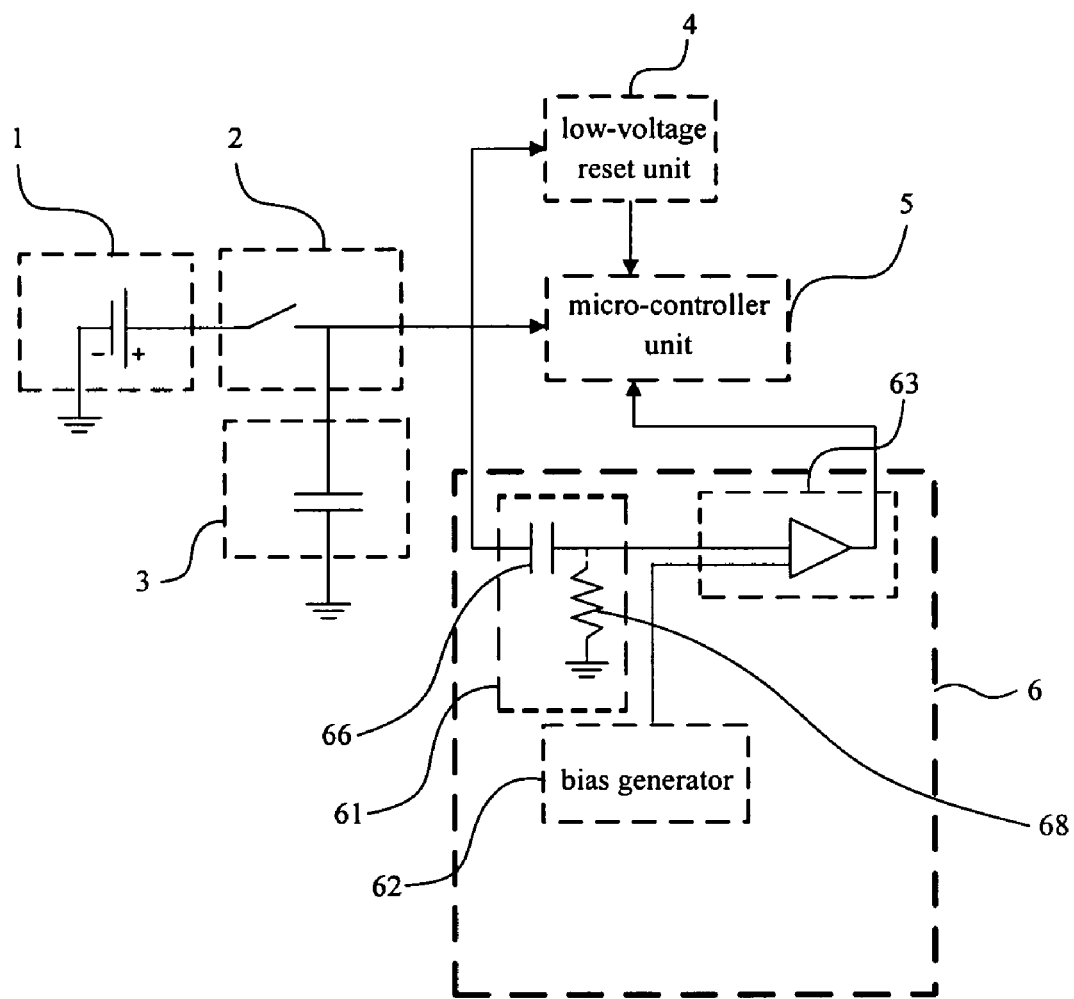
FIG. 1 is a block diagram of an apparatus for awaking an electronic device according to the preferred embodiment of the present invention.
Figure 2:
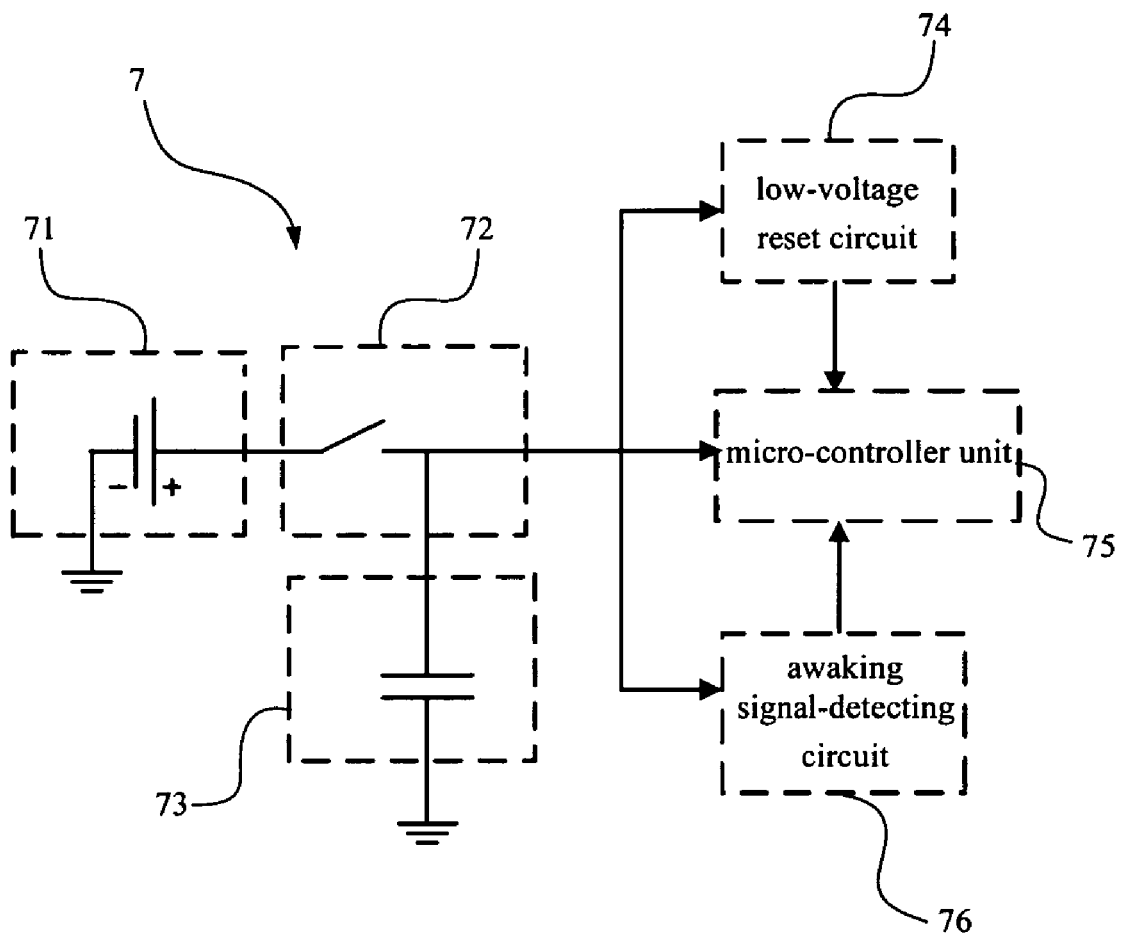
FIG. 2 is a block diagram of a conventional apparatus for awaking an electronic device.

Referring to FIG. 1, shown is an apparatus for switching an electronic device between an active mode and a standby mode according to the preferred embodiment of the present invention. The apparatus includes a power supply 1, a switch 2, a regulating unit 3, a low-voltage reset unit 4, a micro-controller unit 5 and a monitoring and awaking unit 6. The monitoring and awaking unit 6 is used together with the power supply 1, the switch 2, the regulating unit 3, the low-voltage reset unit 4 and a micro-controller unit 5 to render the operation of the electronic device economic and efficient and the switch between the active and standby modes fast.

The power supply 1 is used to supply electricity. The switch 2 is connected to the power supply 1. The regulating unit 3 is connected to the switch 2. The regulating unit 3 may be a capacitor. The low-voltage reset unit 4 is connected to the switch 2. The micro-controller unit 5 is connected to the switch 2.

The monitoring and awaking unit 6 includes an actuator 61 connected to the switch 2, a bias generator 62 and the actuator 61 through a comparator 63 connected to the micro-processing unit 5, as shown in FIG. 1. The control over the power supply 1 by the switch 2 causes change in the voltage of the actuator 61. The actuator 61 is used together with the bias generator 62 and the comparator 63 to generate an awaking signal to awake the micro-processing unit 5.

The actuator 61 may include a capacitor 66 and a resistor 68 connected to the capacitor 66 in series. The output of the actuator 61 is the connective point between the capacitor and the resistor 68 while the input of the actuator 61 is another end of the capacitor 68. Another end of the resistor 68 may be grounded or connected to a fixed reference voltage source. The bias generator 62 may be a stable reference voltage source. The comparator 63 may be a circuit to compare input voltages and provide result output.

In use, the apparatus is connected to the electronic device so that the apparatus turns the electronic device into the standby mode when the electronic device is not used and awakes the electronic device to the active mode via detecting change in the power supply 1. The monitoring and awaking unit 6 monitors the power supply 1 in the standby mode. When the switch 2 is open, the voltage of the power supply 1 drops slowly. The slowly dropping voltage does not generate the awaking signal. When the switch 2 is closed again, the voltage of the power supply 1 rises abruptly. The abruptly rising voltage causes the change in the voltage of the actuator 61. If the rise of the voltage is higher than a level set by the bias generator 62, the comparator 63 will provide the awaking signal to the micro-controller unit 5 to switch the micro-controller unit 5 from the standby mode. The monitoring and awaking unit 6 can detect tiny change in the voltage of the power supply 1 and awake the micro-controller unit 5. Therefore, a user can turned off the electronic device and quickly turn it on again without sacrificing the length of the standby mode or increasing the discharge current apparatus.

The apparatus awakes an electronic device to the active mode from the standby mode in case of the change in the voltage of the power supply so that the operation of the electronic device is economic and efficient and that the change to the active mode from the standby mode is fast.

The present invention has been described via the detailed illustration of the preferred embodiment. Those skilled in the art can derive variations from the preferred embodiment without departing from the scope of the present invention. Therefore, the preferred embodiment shall not limit the scope of the present invention defined in the claims.

The invention claimed is:

1. An apparatus for awaking an electronic device to an active mode from a standby mode in case of change in the voltage of a power supply of the electronic device, the apparatus comprising:
   a power supply for supplying electricity;
   a switch connected to the power supply;
   a low-voltage reset unit connected to the switch;
   a micro-controller unit connected to the switch; and
   a monitoring and awaking unit comprising an actuator connected to the switch, a bias generator and the actuator through a comparator connected to the micro-controller unit so that the control over the power supply by the switch causes change in the voltage of the actuator which cooperates with the bias generator and the comparator to generate an awaking signal to awake the micro-processing unit.

2. The apparatus according to claim 1, further comprising a regulating unit connected to the switch, the regulating unit being a capacitor.

3. The apparatus according to claim 1, wherein the bias generator is a stable reference voltage source.

4. The apparatus according to claim 1, wherein the comparator is a circuit to compare input voltages and provide result output.

5. The apparatus according to claim 1, wherein the actuator comprises a capacitor and a resistor connected to the capacitor in series so that the output of the actuator is the connective point between the capacitor and the resistor while the input of the actuator is another end of the capacitor.

6. The apparatus according to claim 5, wherein another end of the resistor is grounded.

7. The apparatus according to claim 5, wherein another end of the resistor is connected to a fixed reference voltage source.

* * * * *